US012796561B2

(12) United States Patent
Patil et al.

(10) Patent No.: US 12,796,561 B2
(45) Date of Patent: Nov. 10, 2026

(54) PACKAGE-ON-PACKAGE DEVICE INCLUDING REDISTRIBUTION DIE

(71) Applicant: QUALCOMM Incorporated, San Diego, CA (US)

(72) Inventors: Aniket Patil, San Diego, CA (US); Joan Rey Villarba Buot, Escondido, CA (US); Michelle Yejin Kim, Carlsbad, CA (US); Manuel Aldrete, Encinitas, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 587 days.

(21) Appl. No.: 18/455,928

(22) Filed: Aug. 25, 2023

(65) Prior Publication Data

US 2025/0070086 A1 Feb. 27, 2025

(51) Int. Cl.

*H10W 90/00* (2026.01)
*H10W 70/60* (2026.01)
*H10W 70/685* (2026.01)
*H10W 74/10* (2026.01)
*H10W 74/00* (2026.01)

(Continued)

(52) U.S. Cl.

CPC .......... *H10W 90/00* (2026.01); *H10W 70/611* (2026.01); *H10W 70/685* (2026.01); *H10W 74/117* (2026.01); *H10W 70/60* (2026.01); *H10W 74/00* (2026.01); *H10W 90/22* (2026.01);

(Continued)

(58) Field of Classification Search

CPC . H10W 90/00; H10W 70/611; H10W 70/685; H10W 74/117; H10W 70/60; H10W 74/00; H10W 90/22; H10W 90/297; H10W 90/724; H10W 90/752; H10W 70/63; H10W 72/823; H10W 72/01; H10W 72/07254; H10W 72/247; H10W 90/401;

(Continued)

(56) References Cited

U.S. PATENT DOCUMENTS

2015/0206854 A1* 7/2015 Lane .................... H10W 70/09 257/737
2020/0105719 A1 4/2020 Li et al.

(Continued)

OTHER PUBLICATIONS

International Search Report and Written Opinion—PCT/US2024/037866—ISA/EPO—Oct. 15, 2024.

*Primary Examiner* — Elias Ullah
(74) *Attorney, Agent, or Firm* — Moore IP

(57) ABSTRACT

A device includes a bottom substrate including first conductors, a top substrate including second conductors, and a first die disposed between the bottom substrate and the top substrate. The first die includes circuitry and first contacts electrically connected to the circuitry and to the first conductors. The device also includes a redistribution die disposed between the bottom substrate and the top substrate adjacent to the first die. The redistribution die includes second contacts electrically connected to the first contacts through the first conductors and third contacts electrically connected to the second conductors. The redistribution die also includes redistribution traces electrically connected to the second contacts and to the third contacts. The top substrate includes fourth contacts electrically connected through the second conductors to the third contacts to define one or more signal paths between the fourth contacts and the first die.

27 Claims, 8 Drawing Sheets

(51) Int. Cl.
*H10W 90/20* (2026.01)
*H10W 90/22* (2026.01)

(52) U.S. Cl.
CPC ........ *H10W 90/297* (2026.01); *H10W 90/724* (2026.01); *H10W 90/752* (2026.01)

(58) Field of Classification Search
CPC ............. H10W 90/721; H10W 70/614; H10W 90/701
See application file for complete search history.

(56) References Cited

U.S. PATENT DOCUMENTS

| | | | |
|---|---|---|---|
| 2020/0111681 | A1 | 4/2020 | Suk |
| 2022/0068779 | A1 | 3/2022 | Kweon et al. |

* cited by examiner

PACKAGE-ON-PACKAGE DEVICE INCLUDING REDISTRIBUTION DIE

FIELD

Various features relate to integrated circuit devices.

BACKGROUND

Electrical connections exist at each level of a system hierarchy. This system hierarchy includes interconnection of active devices at a lowest system level all the way up to system level interconnections at the highest level. For example, interconnect layers can connect different devices together on an integrated circuit. As integrated circuits become more complex, more interconnect layers are used to provide the electrical connections between the devices. More recently, the number of interconnect levels for circuitry has substantially increased due to the large number of devices that are now interconnected in a modern electronic device. The increased number of interconnect levels for supporting the increased number of devices involves more intricate processes.

State-of-the-art mobile application devices demand a small form factor, low cost, a tight power budget, and high electrical performance. Mobile package design has evolved to meet these divergent goals for enabling mobile applications that support multimedia enhancements. These mobile applications, however, are susceptible to power and signal routing issues when multiple dies are arranged within the small form factor. Design and manufacture of devices for use in mobile applications is challenging due to conflicts among the various design goals. For example, as the performance of integrated circuits increases, the rate of data input and output (I/O) by such integrated circuits also increases. One way to increase the I/O rate of an integrated circuit package is to provide more I/O connections; however, increasing I/O connections tends to increase package size of the integrated circuit package.

SUMMARY

Various features relate to integrated circuit (IC) devices.

One example provides an integrated device that includes a bottom substrate comprising first conductors and a top substrate comprising second conductors. The integrated device also includes a first die disposed between the bottom substrate and the top substrate. The first die includes circuitry and first contacts electrically connected to the circuitry and to the first conductors. The integrated device also includes a redistribution die disposed between the bottom substrate and the top substrate adjacent to the first die. The redistribution die includes second contacts electrically connected to the first contacts through the first conductors and third contacts electrically connected to the second conductors. The redistribution die also includes redistribution traces electrically connected to the second contacts and to the third contacts. The top substrate includes fourth contacts electrically connected through the second conductors to the third contacts to define one or more signal paths between the fourth contacts and the first die.

Another example provides a device that includes a bottom substrate comprising first conductors and a top substrate comprising second conductors. The device also includes a first die disposed between the bottom substrate and the top substrate. The first die includes circuitry and first contacts electrically connected to the circuitry and to the first conductors. The device includes a redistribution die disposed between the bottom substrate and the top substrate. The redistribution die includes second contacts electrically connected to the first contacts through the first conductors and third contacts electrically connected to the second conductors. The redistribution die includes redistribution traces electrically connected to the second contacts and to the third contacts. The device includes a second die electrically connected to fourth contacts of the top substrate, where the fourth contacts are electrically connected through the second conductors to the third contacts to define one or more signal paths between the first die and the second die.

Another example provides a method of fabricating an integrated device that includes coupling a first die to a bottom substrate. Coupling the first die to the bottom substrate includes electrically connecting first contacts of the first die to first conductors of the bottom substrate. The method also includes coupling a redistribution die to the bottom substrate adjacent to the first die. Coupling the redistribution die to the bottom substrate includes electrically connecting second contacts of the redistribution die to the first contacts through the first conductors and electrically connecting third contacts of the redistribution die to second conductors of a top substrate to define one or more signal paths between the first die and a first subset of fourth contacts of the top substrate.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

Figure 1A:
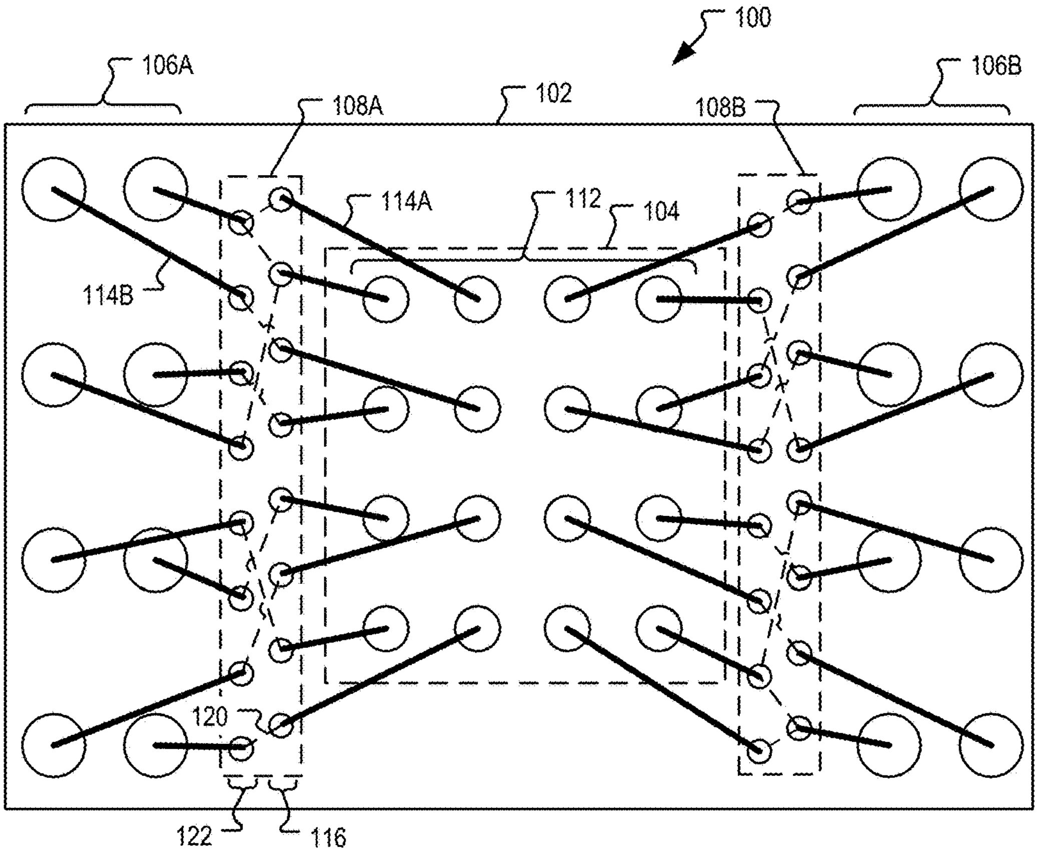
FIG. 1A illustrates a schematic top view of a bottom substrate of an exemplary device including one or more redistribution dies.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Particular aspects of the present disclosure are described below with reference to the drawings. In the description, common features are designated by common reference numbers. As used herein, various terminology is used for the purpose of describing particular implementations only and is not intended to be limiting of implementations. For example, the singular forms "a," "an," and "the" are intended to include the plural forms as well, unless the context clearly indicates otherwise. Further, some features described herein are singular in some implementations and plural in other implementations. For ease of reference herein, such features are generally introduced as "one or more" features and are subsequently referred to in the singular or optional plural (as indicated by "(s)") unless aspects related to multiple of the features are being described.

In some drawings, multiple instances of a particular type of feature are used. Although these features are physically and/or logically distinct, the same reference number is used for each, and the different instances are distinguished by addition of a letter to the reference number. When the features as a group or a type are referred to herein (e.g., when no particular one of the features is being referenced), the reference number is used without a distinguishing letter. However, when one particular feature of multiple features of the same type is referred to herein, the reference number is used with the distinguishing letter. For example, referring to FIG. 1, multiple redistribution dies are illustrated and associated with reference numbers 108A and 108B. When referring to a particular one of these redistribution dies, such as a redistribution die 108A, the distinguishing letter "A" is used. However, when referring to any arbitrary one of these redistribution dies or to these redistribution dies as a group, the reference number 108 is used without a distinguishing letter.

As used herein, the terms "comprise," "comprises," and "comprising" may be used interchangeably with "include." "includes," or "including." As used herein, "exemplary" indicates an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to one or more of a particular element, and the term "plurality" refers to multiple (e.g., two or more) of a particular element.

As used herein, the term "layer" includes a film, and is not construed as indicating a vertical or horizontal thickness unless otherwise stated. As used herein, the term "chiplet" may refer to an integrated circuit block, a functional circuit block, or other like circuit block specifically designed to work with one or more other chiplets to form a larger, more complex chiplet architecture.

Improvements in manufacturing technology and demand for lower cost and more capable electronic devices has led to increasing complexity of ICs. Often, more complex ICs have more complex interconnection schemes to enable interaction between ICs of a device. The number of interconnect levels for circuitry has substantially increased due to the large number of devices that are now interconnected in a state-of-the-art mobile application device.

These interconnections include back-end-of-line (BEOL) interconnect layers, which may refer to the conductive interconnect layers for electrically coupling to front-end-of-line (FEOL) active devices of an IC. The various BEOL interconnect layers are formed at corresponding BEOL interconnect levels, in which lower BEOL interconnect levels generally use thinner metal layers relative to upper BEOL interconnect levels. The BEOL interconnect layers may electrically couple to middle-of-line (MOL) interconnect layers, which interconnect to the FEOL active devices of an IC.

Improvements in technology and increased demand, among other things, are driving performance improvements in integrated circuits. Such performance improvements are often accompanied by increases in the number of I/O connections of newer integrated circuits. For example, projected changes in technology for Double-Data Rate (DDR) memory from DDR5 technology to DDR6 technology foresee a 25% increase in the number of I/O connections. At the same time, there is increasing demand for smaller IC packages. This conflict between demand for smaller IC packages and increased I/O connections presents a challenge to IC package design and manufacturing.

Aspects disclosed herein relate to improvements to IC packages to increase the density of I/O connections (in terms of the number of I/O connections per package area) relative to conventional Package-on-Package (PoP) devices. In PoP devices, two substrates are stacked. Each substrate is attached to at least one die, and signaling (e.g., I/O) between a die on a bottom substrate and a die on the top substrate is routed through a set of interconnect conductors electrically connected to both substrates. The area of the bottom substrate of a PoP device generally includes at least three distinct regions: a die attach region including pads to connect to a flip-chip die, an interconnect region in which interconnect conductors to route signals between substrates are disposed, and a fan-out routing region between the die attach region and the interconnect region.

The size of the die attach region is generally governed by the particular die being used in the PoP device. The size of the interconnect region is related to the number and spacing of the interconnect conductors. Conventional PoP devices typically use solder balls as the interconnect conductors, and the number of such solder balls that can be placed in the interconnect region of the bottom substrate is limited by the diameter of the solder balls and the required pitch between the solder balls. The diameter of the solder balls is sufficient to provide a target standoff distance between the top and bottom substrates (e.g., based on the thickness of the die or other devices disposed between the substrates). Due to these limitations, the surface area of the bottom substrate needed to position a particular number of interconnect conductors in the interconnect region is constrained.

The size of the fan-out routing region is limited based on the number of traces that need to be routed, the size and spacing of such traces, and to some extent the amount of disentanglement among the traces that is needed to electrically connect pads of the die with the interconnect conductors. Aspects disclosed herein enable decreasing the size of the fan-out region by moving much of the fan-out routing from the bottom substrate to a redistribution die.

A redistribution die refers to a component, such as a die, that facilitates electrical connection or electrical signaling between other components, such as other dies. For example, the redistribution die facilitates electrical connection between one component and another component where the one and another components have contacts or pads with different spacing and/or orientation and/or size. The redistribution die provides contacts that match the components to facilitate electrical connection, without modifying electrical characteristics of signals sent therebetween. The redistribution die includes passive interconnects (referred to herein as "redistribution traces") defining conductive pathways between pairs of externally facing contacts of the redistribution die such that each pair of the externally facing contacts is configured to enable signal routing between two other components that are electrically connected to the redistribution die.

In one embodiment the redistribution die's primary function is to operate to facilitate electrical connections. In another embodiment the redistribution die may perform other die functions in addition to redistribution functions.

The redistribution die can be manufactured using semiconductor fabrication techniques, which are able to form more densely packed traces than can be manufactured using substrate manufacturing techniques. By using narrower, more closely spaced traces, the redistribution die can perform fan-out routing in less area than would be needed to provide similar fan-out routing in the bottom substrate. Thus, the redistribution die enables increased I/O routing without corresponding increase in the fan-out routing region. In some cases, the redistribution die can reduce the fan-out routing region sufficiently to enable addition of additional interconnect conductors without a corresponding increase in the package size. For example, it is projected that using redistribution dies can enable formation of a DDR6-based PoP device in the same or a smaller form factor than has conventionally been used for DDR5-based PoP devices using substrate-based fan-out connections.

In some implementations disclosed herein, the redistribution dies include both fan-out routing connections and through vias (e.g., through silicon vias). The through vias can replace some or all of the conventional interconnect conductors (e.g., solder balls) used to electrically connect the top and bottom substrates. In such implementations, the fan-out routing region is reduced (relative to substrate-based fan-out connections) and the interconnect region is reduced (relative to conventional solder ball-based interconnections), leading to even smaller PoP packages. Further, in such implementations, the through vias are integrated within a die and are thus not subject to the same spacing constraints as solder balls used for substrate interconnection. For example, the redistribution die can be manufactured to provide any desired stand-off height between the substrates, and the stand-off height does not limit the spacing of the through vias. In contrast, when solder balls are used, increasing the stand-off height increases the diameter of the solder balls, thereby decreasing the number of solder balls that can be placed side by side within a given area. As another example, through vias of the redistribution die can be formed using semiconductor fabrication techniques, which enable formation of much smaller and more closely packed features. Thus, the through vias can be smaller and more densely packed than solder balls.

In addition to more efficient use of PoP substrate area, using redistribution dies rather than substrate-based fan-out connections provides shorter signal paths between the dies of the top and bottom substrates. Shorter signal paths improve communication speeds between the dies. Further, the long, fine traces used in conventional laminate substrates for fan-out routing can suffer from poor signal integrity and are generally correlated with lower fabrication yield. Using the redistribution die(s) disclosed herein enables use of shorter traces in the substrate, which should improve substrate yield and signal integrity.

Thus, technical benefits of various implementations disclosed herein relative to conventional PoP packaging techniques include at least, more efficient use of package area, which enables an increase in I/O connections (e.g., between dies in the same size or a smaller size package), reduction in the package size, or both. Further technical benefits include improved I/O connections speeds and signal integrity due to shorter signal paths, and improved laminate substrate yield.

Exemplary Device Including Redistribution Die(s)

Figure 1B:
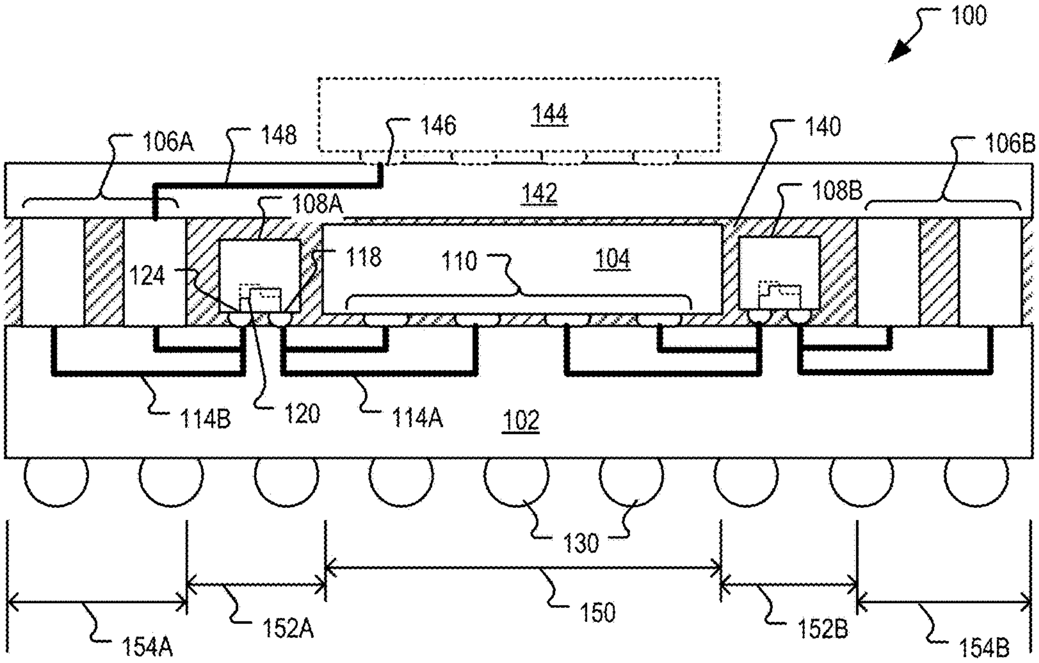
FIG. 1B illustrates a schematic cross-sectional profile view of the exemplary device of FIG. 1A.

FIG. 1A illustrates a schematic top view of aspects of an exemplary device 100 that includes one or more redistribution dies 108 (including a redistribution die 108A and a redistribution die 108B). In particular, FIG. 1A illustrates a top view of a bottom substrate 102 of the device 100 and indicates positions of a die 104, the redistribution die(s) 108, and redistribution traces 120 of the redistribution die(s) 108 relative to the bottom substrate 102 using dashed lines. FIG. 1B illustrates a schematic cross-sectional profile view of the exemplary device 100 of FIG. 1A.

The device 100 has a package-on-package (PoP) configuration in which the die 104 is disposed between the bottom substrate 102 and a top substrate 142. The device 100 optionally includes a die 144 coupled to the top substrate 142, which is illustrated in dotted lines to indicate that the die 144 is optional and/or interchangeable in some implementations. The PoP configuration is configured to enable signaling between the dies 104, 144, signaling between one or more of the dies 104, 144 and one or more off-package devices (e.g., via off-package contacts 130, such as a ball grid array), or both. While two dies 104, 144 are illustrated, the device 100 can include more than two dies, and can optionally include other devices (not shown), such as passive devices.

Each of the dies 104, 144 can include integrated circuitry, such as a plurality of transistors and/or other circuit elements. Components of the integrated circuitry can be formed in and/or over a semiconductor substrate. Different implementations can use different types of transistors to form active circuitry, such as a field effect transistor (FET), planar FET, finFET, a gate all around FET, or mixtures of transistor types. The active circuitry can be arranged and interconnected to form processing logic blocks (e.g., transistor blocks), memory blocks, etc. In addition to active circuitry, the integrated circuitry can also include a power distribution network (PDN). To illustrate, a PDN can include, for example, one or more power rails, one or more ground rails, etc. In some implementations, a front end of line (FEOL) process may be used to fabricate the integrated circuitry in and/or over the semiconductor substrate.

The die 104 is illustrated as having a flip-chip configuration including a set of contacts 110 that are electrically connected to integrated circuitry of the die 104 and configured to couple to corresponding contacts 112 of the bottom substrate 102. The bottom substrate 102 includes conductors 114A electrically connected to respective ones of the contacts 112 and electrically connected to contacts 116 of the bottom substrate 102. The contacts 116 are configured to be electrically connected to corresponding contacts 118 of the redistribution die(s) 108.

The redistribution die(s) 108 include redistribution traces 120 electrically connected to the contacts 118 and to contacts 124 of the redistribution die(s) 108. The redistribution traces 120 are configured to disentangle the electrical connections from various ones of the contacts 110 of the die 104 to appropriate interconnect conductors 106. For example, the redistribution traces 120 can be arranged in two or more layers of the redistribution die(s) 108 such that two or more of the redistribution traces 120 can hop over/under one another to route between pairs of contacts 110 and interconnect conductors 106. The redistribution die(s) 108 can include semiconductor die(s) in which the redistribution traces 120 are integrated using semiconductor fabrication techniques (e.g., wafer-level patterning and deposition). As a result, the redistribution traces 120 can be finer (e.g., narrower) and more closely spaced than the conductors 114 (which are formed, for example, using lamination techniques). The finer, more closely spaced lines of the redistribution traces 120 enables the redistribution traces 120 to disentangle the electrical connections between contacts 110 and interconnect conductors 106 in a smaller fan-out routing region 152 than would be required to perform the same disentanglement using the conductors 114 of the substrate 102.

The contacts 124 of the redistribution die 108 are configured to be electrically connected to corresponding contacts 122 of the bottom substrate 102. The contacts 122 are electrically connected to conductors of the bottom substrate 102, such as the conductors 114B. The conductors 114B are electrically connected to the interconnect conductors 106.

The interconnect conductors 106 are electrically connected to conductors 148 of the top substrate 142. The conductors 148 of the top substrate 142 are electrically connected to contacts 146 of the top substrate 142. The contacts 146 are configured to be electrically connected to contacts of a die 144.

In the example illustrated in FIGS. 1A and 1B, the device 100 includes two redistribution dies 108A, 108B and two sets of interconnect conductors 106A, 106B. In this example, the redistribution dies 108A and 108B are disposed in respective fan-out routing regions 152A and 152B. The interconnect conductors 106A and 106B are arranged in respective interconnect regions 154A and 154B, and the die 104 is disposed in a die attach region 150. Thus, an overall lateral dimension of the bottom substrate 102 is constrained by dimensions of the interconnect regions 154, the fan-out routing regions 152, and the die attach region 150. The fan-out routing regions 152 associated with the redistribution dies 108 are smaller (e.g., shorter in the lateral dimension illustrated in FIG. 1B) than would be needed to route the same signal paths through the bottom substrate 102. As a result, the interconnect regions 154 can be enlarged, to accommodate more interconnect conductors 106 without increasing the overall lateral dimension of the bottom substrate 102. In some implementations, the overall lateral dimension of the bottom substrate 102 can even be reduced relative to an implementation in which the same signal paths are routed through the bottom substrate 102.

As illustrated in FIG. 1B, the device 100 can optionally include a mold compound 140 disposed between the bottom substrate 102 and the top substrate 142. For example, the mold compound 140 can at least partially encapsulate the die 104, the redistribution die(s) 108, the interconnect conductors 106, or a combination thereof. For example, the interconnect conductors 106 can include through mold vias or solder balls disposed within the mold compound 140.

Figure 2A:
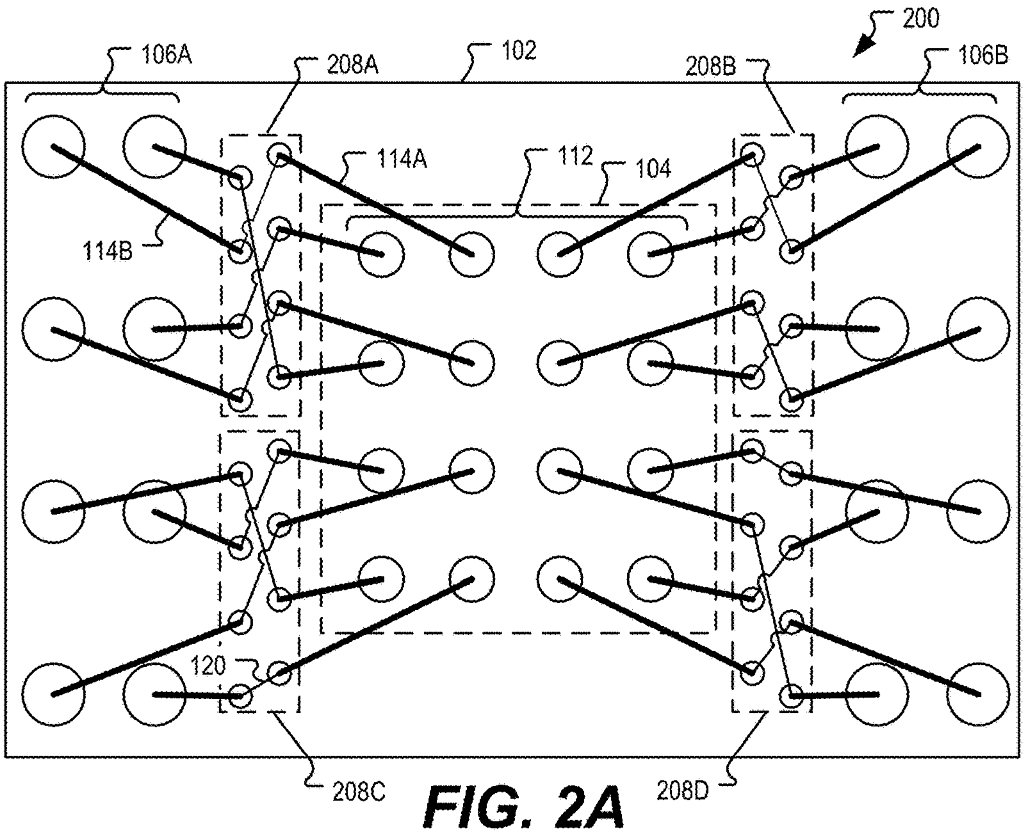
FIG. 2A illustrates a schematic top view of a bottom substrate of another exemplary device including redistribution dies.
Figure 2B:
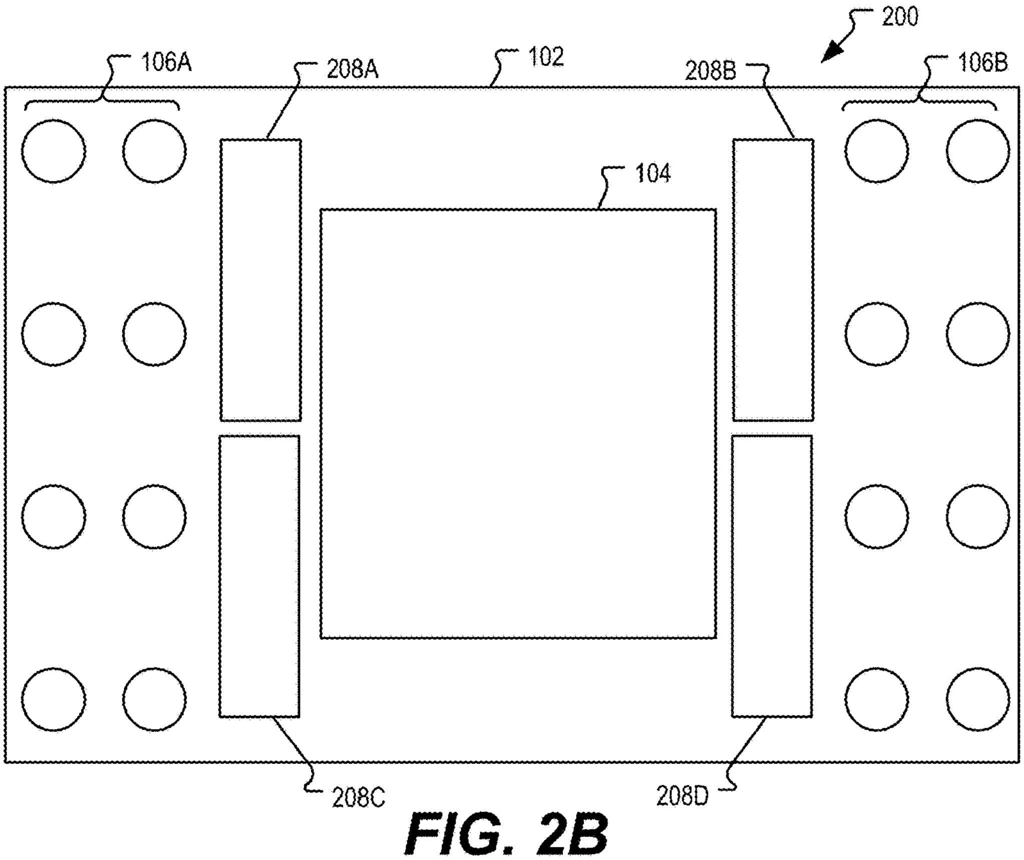
FIG. 2B illustrates a schematic top view of the exemplary device of FIG. 2A with a top substrate omitted.

FIGS. 2A and 2B illustrate aspects of another exemplary device 200 that includes redistribution dies 208 (including redistribution dies 208A, 208B, 208C, and 208D). In particular, FIG. 2A illustrates a schematic top view of a bottom substrate 102 of the device 200, and FIG. 2B illustrates a schematic top view of the device 200 with a top substrate (e.g., the top substrate 142 of FIG. 1B) omitted. A cross-sectional side view of the device 200 is identical to the view illustrated in FIG. 1B, and is therefore, not repeated.

The device 200 of FIGS. 2A and 2B is identical to the device 100 of FIGS. 1A and 1B except that in the case of the device 200, multiple redistribution dies 208 are positioned on each side of the die 104 to provide fan-out routing and disentanglement for signal paths between the contacts 112 of the die 104 and the interconnect conductors 106. In some implementations, each of the redistribution dies 208 is associated with a different communication channel between the die 104 and the die 144 (illustrated in FIG. 1B). For example, the die 144 can include or correspond to a four channel DDR memory chip, in which case each of the four redistribution dies 208 of FIGS. 2A and 2B may be configured to route signals associated with a corresponding one of the four channels.

A technical benefit of using several redistribution dies 208 on each side of the die 104 rather than one monolithic redistribution die 108 on each side is that the redistribution dies 208 are smaller than the redistribution die 108, and fabrication of smaller dies is generally associated with higher yield and therefore lower cost. Additionally, using multiple redistribution dies 208 increases design flexibility. For example, if there are changes to the design of the device 200, it may be possible to update fewer than all of the redistribution dies 208. As another example, one or more of the redistribution dies 208 may be useable over several different product lines (e.g., distinct types of the device 200), further reducing cost.

Figure 3A:
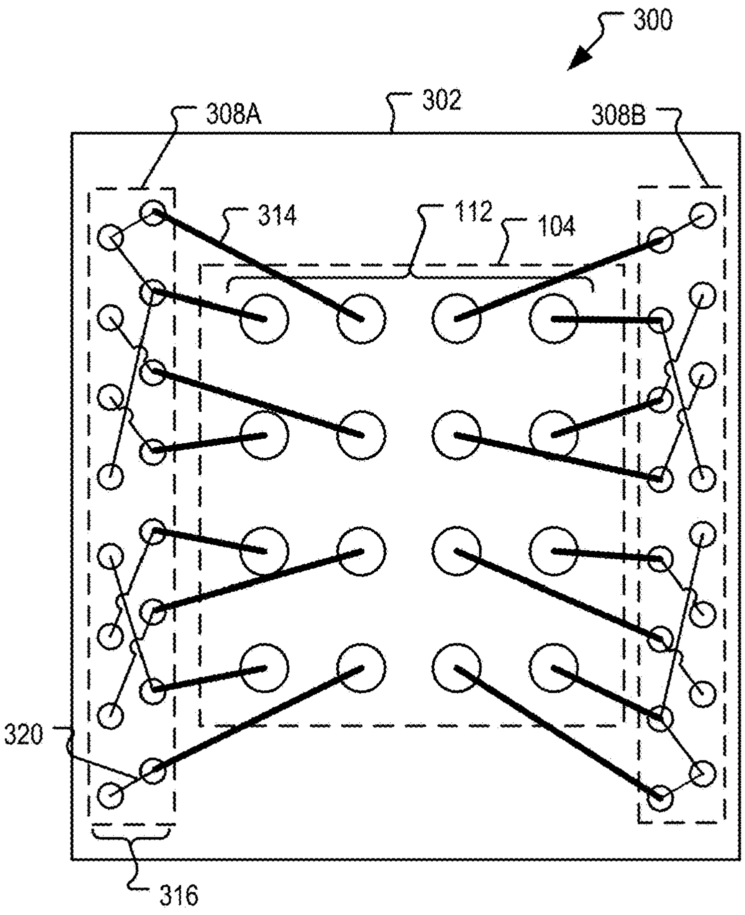
FIG. 3A illustrates a schematic top view of a bottom substrate of an exemplary device including one or more redistribution dies.
Figure 3B:
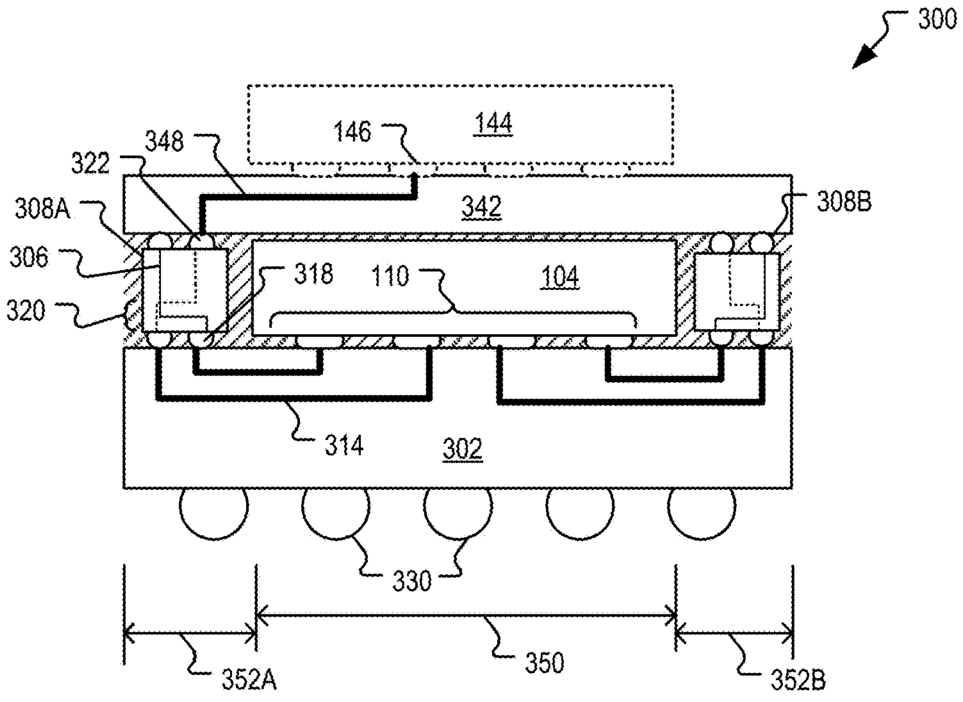
FIG. 3B illustrates a schematic cross-sectional profile view of the exemplary device of FIG. 3A.

FIG. 3A illustrates a schematic top view of aspects of another exemplary device 300 that includes one or more redistribution dies 308 (including a redistribution die 308A and a redistribution die 308B). In particular, FIG. 3A illustrates a top view of a bottom substrate 302 of the device 300 and indicates positions of a die 104 and the redistribution die(s) 308 relative to the bottom substrate 302 using dashed lines. FIG. 3B illustrates a schematic cross-sectional profile view of the exemplary device 300 of FIG. 3A. The device 300 is similar to the device 100 of FIGS. 1A and 1B or the device 200 of FIGS. 2A and 2B, except that interconnect conductors 306 of the device 300 are integrated within the redistribution dies 308.

Like the devices 100 and 200, the device 300 has a PoP configuration in which the die 104 is disposed between the bottom substrate 302 and a top substrate 342. The device 300 optionally includes the die 144 coupled to the top substrate 342. While two dies 104, 144 are illustrated, the device 300 can include more than two dies, and can optionally include other devices (not shown), such as passive devices.

In FIGS. 3A and 3B, the contacts 110 of the die 104 are electrically connected to integrated circuitry of the die 104 and configured to couple to corresponding contacts 112 of the bottom substrate 302. The bottom substrate 302 includes conductors 314 electrically connected to respective ones of the contacts 112 and electrically connected to respective ones of contacts 316 of the bottom substrate 302. The contacts 316 are configured to electrically connect to corresponding contacts 318 of the redistribution die(s) 308.

The redistribution die(s) 308 include redistribution traces 320 electrically connected to the contacts 318 and to interconnect conductors 306 integrated within the redistribution die(s) 308. For example, the redistribution die(s) 308 can include semiconductor die(s) in which the redistribution traces 320 and the interconnect conductors 306 are integrated using semiconductor fabrication techniques (e.g., wafer-level patterning and deposition). To illustrate, the interconnect conductors 306 can include or correspond to through silicon vias formed in the redistribution die(s) 308. The interconnect conductors 306 are coupled, via contacts 322, to conductors 348 of the top substrate 342.

As described with reference to FIGS. 1A and 1B, the redistribution traces 320 can be finer (e.g., narrower) and more closely spaced than the conductors 314 (which are formed, for example, using lamination techniques). Further, the interconnect conductors 306 can be finer and more closely spaced than conventional interconnect conductors, such as solder balls or through mold vias. Further, the interconnect conductors 306 and the redistribution traces 320 can be vertically (in the orientation illustrated in FIG. 3B) stacked. Accordingly, the device 300 exhibits each of the technical benefits described with reference to FIGS. 1A and 1B, and has the further technical benefit of eliminating or reducing the interconnect regions 154 of FIG. 1B. Thus, an overall lateral dimension of the bottom substrate 302 is constrained by dimensions of a die attach region 350 and the fan-out routing regions 352A and 352B. The fan-out routing regions 352 associated with the redistribution dies 308 are smaller (e.g., shorter in the lateral dimension illustrated in FIG. 3B) than would be needed to route the same signal paths through the bottom substrate 302. Additionally, an interconnect region (e.g., the interconnect regions 154 of FIG. 1B) that would be needed to accommodate conventional interconnect conductors (e.g., the interconnect conductors 106) is eliminated, reducing the overall lateral dimension of the bottom substrate 302.

While the example illustrated in FIGS. 3A and 3B shows all of the interconnect conductors 306 integrated within the redistribution dies 308, in other implementations, fewer than all of the interconnect conductors 306 are integrated within the redistribution dies 308. For example, signals communicated between the dies 104 and 144 can be routed through the redistribution dies 308, and the device 300 can include conventional interconnect conductors (e.g., the interconnect conductors 106) that are configured to route signals between the die 144 and off-package devices via contacts 330. As another example. A first subset of the signals communicated between the dies 104 and 144 can be routed through the redistribution dies 308 and a second subset of the signals communicated between the dies 104 and 144 can be routed through conventional interconnect conductors (e.g., the interconnect conductors 106).

In the example illustrated in FIGS. 3A and 3B, the device 300 is shown with two redistribution dies 308A, 308B. However, in other implementations, either or both of the redistribution dies 308A, 308B can be replaced by two or more smaller redistribution dies, as described with reference to FIGS. 2A and 2B.

The diagrams illustrated in FIGS. 1A-3B are merely schematic, and are intended to highlight particular features of the various devices illustrated. For example, the specific number of contacts, interconnections, and other components is merely illustrative, and not limiting. Further, certain internal structures have been omitted from the diagrams. For example, the bottom substrate 102 or the bottom substrate 302 can include additional conductors that are configured to electrically connect the die 104, the die 144, or both, to off-package devices via the contacts 130, 330, respectively. Further, certain components are illustrated in a particular manner merely to illustrate a particular aspect. For example, connections between the contacts 118, 124 of the redistribution dies 108 and corresponding contacts 116, 122 of the bottom substrate are illustrated as formed using solder bumps merely to highlight where separate components of an electric connection are positioned. In other implementations, other interconnection techniques (such as pad-to-pad bonding) are used to electrically connect the various contacts.

While FIGS. 1A-3B illustrate examples of devices that include connections for two dies, in other examples, a device can include more than two dies. Further, the devices 100, 200, 300 of FIGS. 1A-3B can be integrated with or included within a wide variety of other devices. For example, a device that includes one or more of the devices 100, 200, 300 disclosed herein can include components such as a power management integrated circuit (PMIC), an application processor, a modem, a radio frequency (RF) device, a passive device, a filter, a capacitor, an inductor, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. In such devices, the device(s) disclosed herein can operate as any of these components (or a combination of these components) that includes active circuitry.

Exemplary Sequence for Fabricating a Device Including Redistribution Die(s)

Figure 4A:
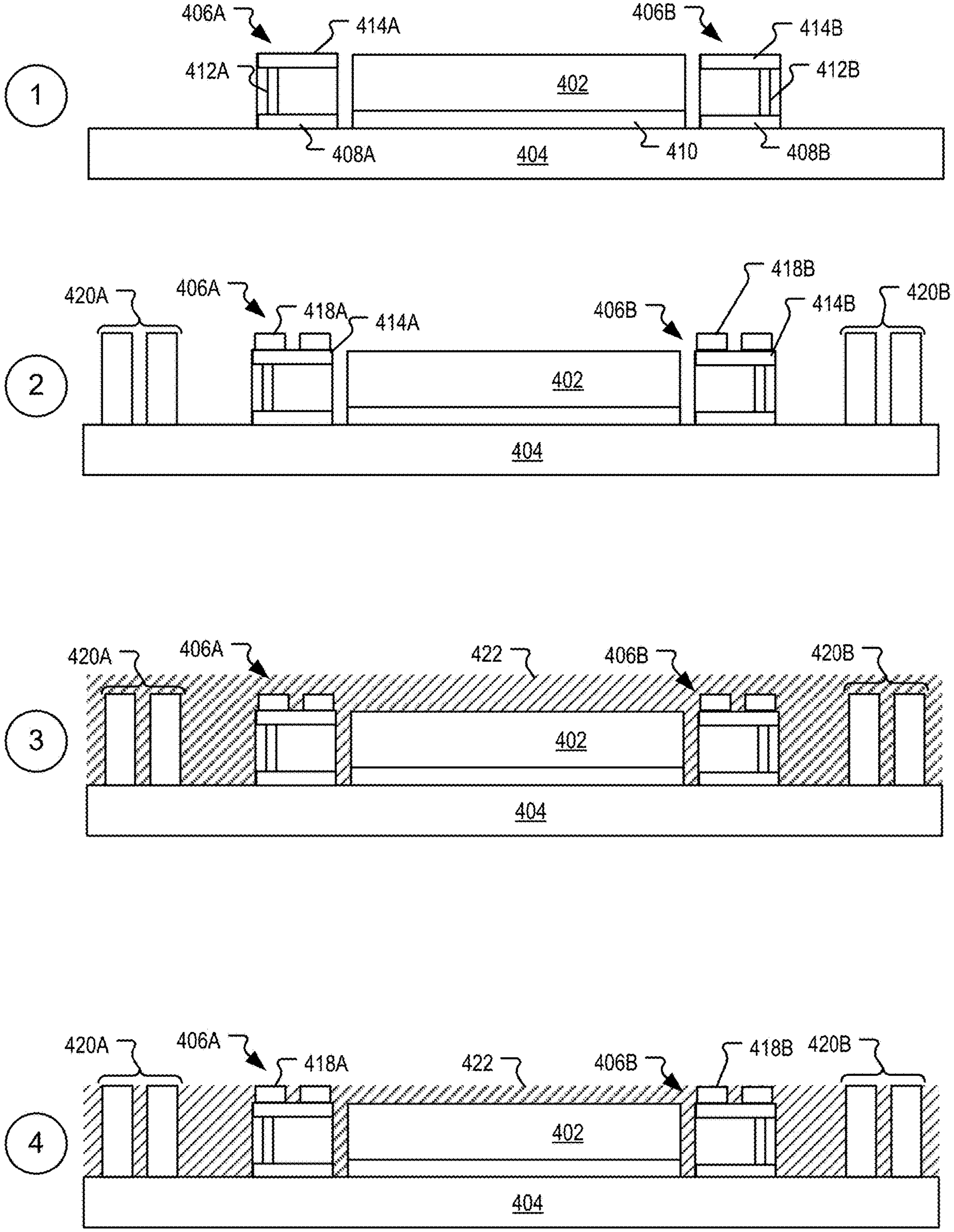
FIGS. 4A and 4B illustrate a first exemplary sequence for fabricating a device including one or more redistribution dies.
Figure 4B:
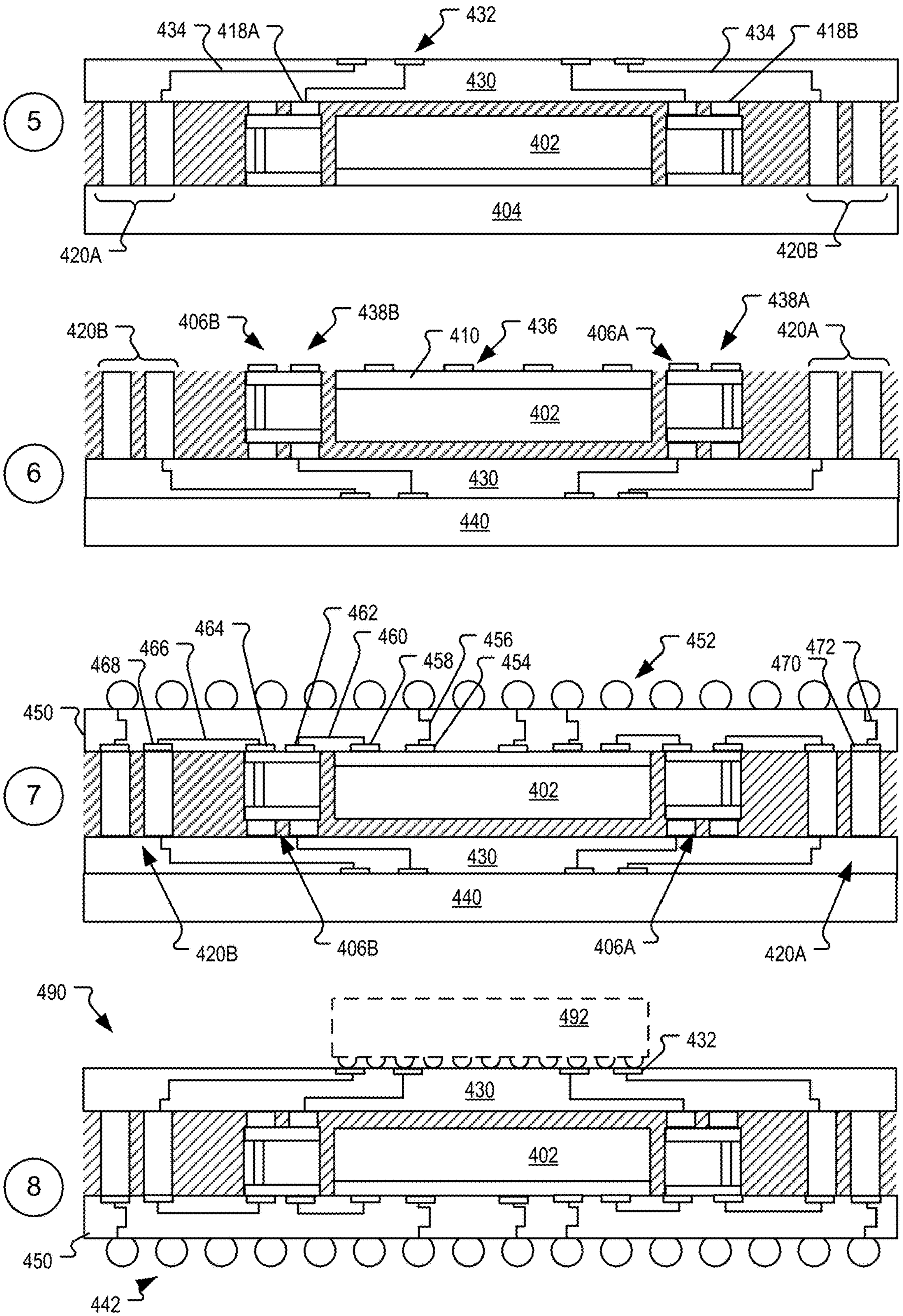

In some implementations, fabricating a device that includes one or more redistribution dies (e.g., any of the devices 100, 200, or 300) includes several processes. FIGS. 4A and 4B illustrate a first exemplary sequence for providing or fabricating a device (e.g., device 490 illustrated at Stage 8 of FIG. 4B) that includes one or more redistribution dies, as described with reference to any of FIGS. 1A-3B. In some implementations, the sequence of FIGS. 4A and 4B may be used to provide (e.g., during fabrication of) one or more of the devices 100, 200, or 300 of FIGS. 1A-3B.

It should be noted that the sequence of FIGS. 4A and 4B may combine one or more stages in order to simplify and/or clarify the sequence for providing or fabricating an integrated device. In some implementations, the order of the processes may be changed or modified. In some implementations, one or more of the processes may be replaced or substituted without departing from the scope of the disclosure. In the following description, reference is made to various illustrative Stages of the sequence, which are numbered (using circled numbers) in FIGS. 4A and 4B. Each of the various stages of the sequence illustrated in FIGS. 4A and 4B shows one device being formed; however, in some implementations, multiple devices are formed concurrently, e.g., using wafer-level or strip-level processing techniques.

Stage 1 of FIG. 4A illustrates a state after a die 402 and one or more redistribution dies 406 (e.g., redistribution dies 406A and 406B) have been coupled to a carrier 404. In the example illustrated in FIG. 4A, the die 402 includes an active area 410 that includes integrated circuitry and contacts (e.g., the contacts 110 of FIG. 1B or 3B). In this example, the active area 410 is disposed adjacent to the carrier 404.

The redistribution die(s) 406 of FIGS. 4A and 4B are illustrated as including redistribution traces 408 (e.g., redistribution traces 408A of redistribution die 406A and redistribution traces 408B of redistribution die 406B) on a side adjacent to the carrier 404, redistribution traces 414 (e.g., redistribution traces 414A of redistribution die 406A and redistribution traces 414B of redistribution die 406B) on a side opposite the carrier 404, and interconnect conductors 412 (e.g., interconnect conductors 412A of redistribution die 406A and interconnect conductors 412B of redistribution die 406B) therebetween. The interconnect conductors 412 are optional and are omitted in some cases. For example, the interconnect conductors 412 can be omitted when the device being fabricated uses the interconnect conductors 106 of FIGS. 1A-2B to route signals between a top and bottom substrate. Additionally, or alternatively, in some implementations, the redistribution die(s) 406 include redistribution traces on only one side. For example, the redistribution die(s) 406 may omit either the redistribution traces 408 or the redistribution traces 414.

Stage 2 illustrates a state after formation of interconnect conductors 420 (e.g., interconnect conductors 420A and interconnect conductors 420B). In the example illustrated in FIG. 4A, the interconnect conductors 420 are shown as pillars (e.g., copper pillars). The interconnect conductors 420 can be formed, for example, using plating techniques guided by one or more mask layers (e.g., a patterned dry film or photoresist layer). Although FIG. 4A illustrates the interconnect conductors 420 as pillars, in other examples, the interconnect conductors 420 can include or correspond to solder balls or solder plated copper balls. In such implementations, automated placement techniques can be used to position the interconnect conductors 420.

In some implementations, formation of the interconnect conductors 420 can be omitted. For example, if the redistribution die(s) 406 include the interconnect conductors 412 and the interconnect conductors 412 are sufficient to support all of the electrical connections needed between a top and bottom substrate, the interconnect conductors 420 are not needed and can be omitted.

The state illustrated at Stage 2 also shows that contacts 418 (e.g., contacts 418A and contacts 418B) have been formed on the redistribution die(s) 406. Formation of the contacts 418 is optional, and can be omitted if the redistribution die(s) 406 do not include electrical connections to a top substrate, which may be the case when the redistribution die(s) 406 do not include the interconnect conductors 412 and do not include the redistribution traces 414. In the example illustrated in FIG. 4A, the contacts 418 can be formed, for example, using plating techniques guided by one or more mask layers (e.g., a patterned dry film or photoresist layer).

Stage 3 illustrates a state after a mold compound 422 is disposed on the carrier 404, the die 402, the redistribution die(s) 406, and the interconnect conductors 420 (if present). In a particular example, a deposition process, a spin-on process, or a similar process can be used to apply the mold compound 422, and the mold compound 422 can subsequently be cured or hardened by exposure to light, heat, and/or chemical hardening agents.

Stage 4 illustrates a state after one or more material removal operations have been performed to reveal portions of interconnect conductors 420, the contacts 418, or both, depending on the specific combination of interconnect conductors 420 and contacts 418 previously formed. The material removal operations can include, for example, etching operations, grinding operations, or both.

Stage 5 of FIG. 4B illustrates a state after a top substrate 430 is formed or attached. The top substrate 430 includes contacts 432 configured to be connected to another die and conductors 434 electrically connected to the contacts 432 and to the interconnect conductors 420, the contacts 418, or both, depending on the specific combination of interconnect conductors 420 and contacts 418 previously formed. In some implementations, the top substrate 430 is preformed and attached to the interconnect conductors 420, the contacts 418, or both, to achieve the state illustrated at Stage 5. Alternatively, the top substrate 430 can be formed on a surface of the mold compound as well as the interconnect conductors 420, the contacts 418, or both, using redistribution layer formation techniques. For example, the redistribution layer formation techniques can include, without limitation, application of alternating layers of dielectric materials (e.g., dry film layers) and patterned metal layers and formation of interconnects between the metal layers.

Stage 6 illustrates a state after the carrier 404 is removed and a carrier 440 is attached to the top substrate 430. Removal of the carrier 404 exposes contacts 438 (e.g., contacts 438A and contacts 438B) of the redistribution die(s) 406 and contacts 436 of the die 402. The contacts 436 of the die 402 can correspond to or include the contacts 110 of the die 104 of any of FIGS. 1A-3B. In some implementations, the contacts 438 correspond to or include the contacts 118 and 124 of FIG. 1B. In some implementations, the contacts 438 correspond to or include the contacts 318 of FIG. 3B.

Stage 7 illustrates a state (which is inverted relative to the state at Stage 6) after a bottom substrate 450 is formed or attached. In the example illustrated in FIG. 4B, the bottom substrate 450 includes contacts 452, contacts 454, contacts 458, contacts, 462, contacts 464, contacts 468, and contacts 470 and conductors electrically connecting various ones of the contacts 452, 454, 458, 462, 464, 468, 470. In some implementations, the bottom substrate 450 is preformed and attached to the interconnect conductors 420, the contacts 438, the contacts 436, or a combination thereof, to achieve the state illustrated at Stage 7. Alternatively, the bottom substrate 450 can be formed on a surface of the mold compound 422 as well as the interconnect conductors 420, the contacts 438, the contacts 436, or a combination thereof, using redistribution layer formation techniques. For example, the redistribution layer formation techniques can include, without limitation, application of alternating layers of dielectric materials (e.g., dry film layers) and patterned metal layers and formation of interconnects between the metal layers.

The contacts 452 correspond to or include the contacts 130 of FIG. 1B or the contacts 330 of FIG. 3B. The contacts 452 are configured to provide connections to one or more off-package devices. For example, one or more of the contacts 452 can be connected, via conductors 472, to one or more of the interconnect conductors 420 to provide a signal path between a die (e.g., a second die 492 illustrated in Stage 8) and the off-package device(s). As an example, one or more of the contacts 452 can be connected, via conductors 456, to one or more of the contacts 454 to provide a signal path between the die 402 and the off-package device(s). In this example, the contacts 454 correspond to or include one or more of the contacts 112 of any of FIG. 1A, 2A, or 3A.

The contacts 458 are electrically connected to the die 402 and, via conductors 460, to the contacts 462. Each of the contacts 462 is electrically connected to a corresponding one of the contacts 438 of the redistribution die(s) 406. For example, the conductors 460 can correspond to or include the conductors 114A of FIG. 1A, 1B or 2B. In this example, the contacts 462 correspond to the contacts 116. As another example, the conductors 460 can correspond to or include the conductors 314 of FIGS. 3A and 3B. In this example, the contacts 462 correspond to the contacts 316.

The contacts 468 are electrically connected to the interconnect conductors 420 and, via conductors 466, to the contacts 464. Note that in some implementations, the interconnect conductors 420 are omitted (e.g., as in FIGS. 3A and 3B), in which case the contacts 468, the conductors 466, and the contacts 464 are also omitted. If present, each of contacts 464 is electrically connected to a corresponding one of the contacts 438 of the redistribution die(s) 406. For example, the conductors 460 can correspond to or include the conductors 114B of FIG. 1A, 1B or 2B.

Stage 8 illustrates a state (which is inverted relative to the state at Stage 7) after the carrier 440 is removed. If the operations described with reference to Stages 1-7 above are performed in a manner that forms two or more devices (e.g., device 490) concurrently, the state illustrated at Stage 8 is after singulation of the devices. For example, one or more delamination processes can be used to remove the device 490 from the carrier 440, and one or more cutting operations can be used to separate devices 490 from one another.

Formation of the device 490 is complete at Stage 8 of FIG. 4B. However, in some implementations, a second die 492 can be coupled to the top substrate 430 and electrically connected to the interconnect conductors 420, to the redistribution die(s) 406, or both, to enable communication between the die 402 and the second die 492 and/or communication between the second die 492 and one or more off-package devices via the contacts 442.

Figure 5:
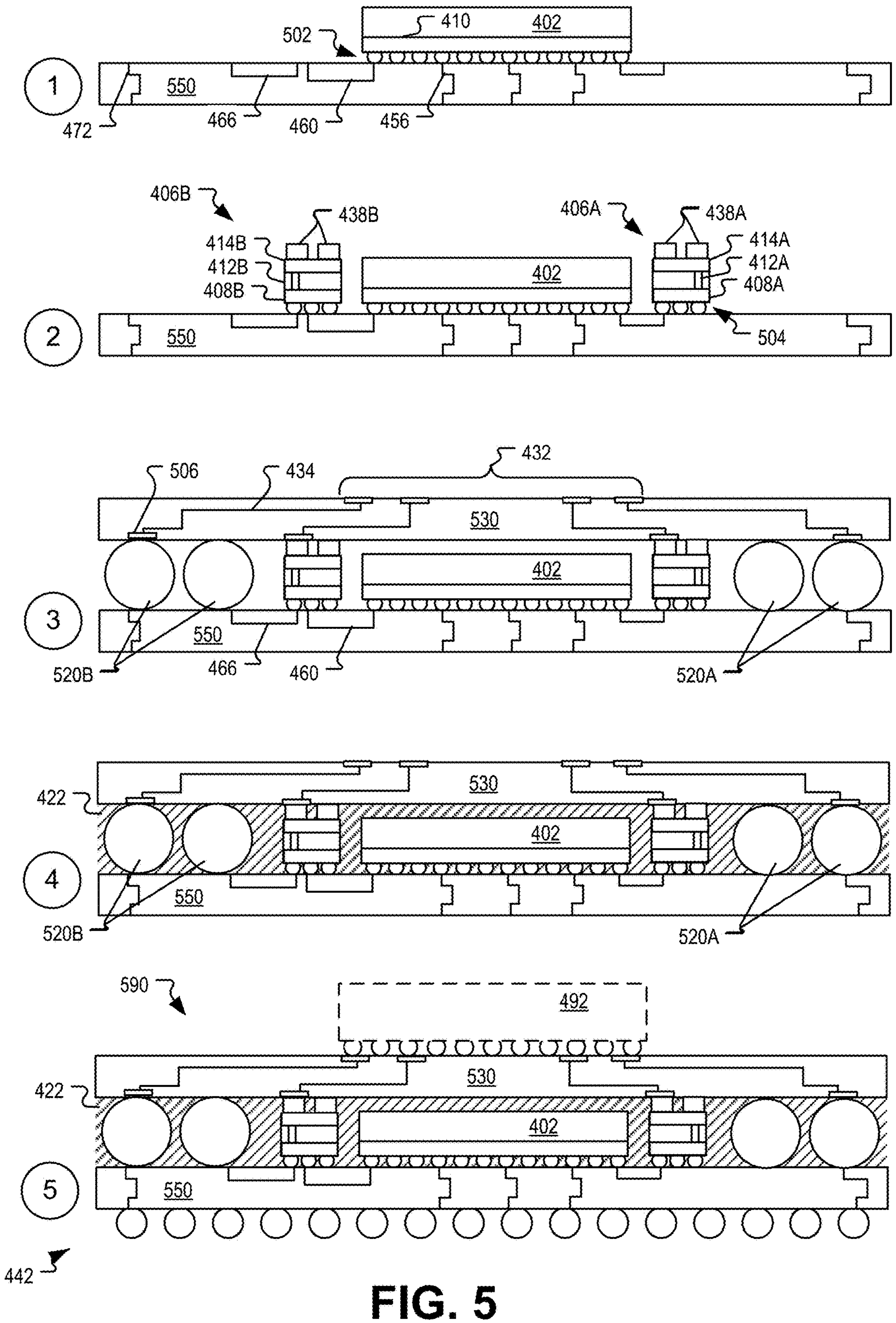
FIG. 5 illustrates a second exemplary sequence for fabricating a device including one or more redistribution dies.

FIG. 5 illustrates a second exemplary sequence for providing or fabricating a device (e.g., a device 590 illustrated at Stage 5 of FIG. 5) that includes one or more redistribution dies, as described with reference to any of FIGS. 1A-3B. In some implementations, the sequence of FIG. 5 may be used to provide (e.g., during fabrication of) one or more of the devices 100, 200, or 300 of FIGS. 1A-3B.

It should be noted that the sequence of FIG. 5 may combine one or more stages in order to simplify and/or clarify the sequence for providing or fabricating an integrated device. In some implementations, the order of the processes may be changed or modified. In some implementations, one or more of the processes may be replaced or substituted without departing from the scope of the disclosure. In the following description, reference is made to various illustrative Stages of the sequence, which are numbered (using circled numbers) in FIG. 5. Each of the various stages of the sequence illustrated in FIG. 5 shows one device being formed; however, in some implementations, multiple devices are formed concurrently, e.g., using wafer-level or strip-level processing techniques.

The sequence of FIG. 5 differs from the sequence of FIGS. 4A and 4B primarily in the use of preformed substrates and solder balls (e.g., copper core solder balls). Many of the other features are similar or identical to those described with reference to FIGS. 4A and 4B and are assigned the same reference numbers as are used in FIGS. 4A and 4B (or in some cases omitted to simplify the drawings).

Stage 1 of FIG. 5 illustrates a state after the die 402 has been placed on a bottom substrate 550. In the example illustrated in FIG. 5, the die 402 includes the active area 410 that includes integrated circuitry and contacts (e.g., the contacts 110 of FIG. 1B or 3B), which are electrically connected, via solder bumps 502, to corresponding contacts (e.g., the contacts 112) of the bottom substrate 550. The bottom substrate 550 includes, for example, a preformed laminate substrate including metal layers separated from one another by dielectric layers. The metal layers are patterned and interconnected to define a plurality of conductors. The conductors in FIG. 5 include, for example, one or more conductors 456 configured to electrically connect a contact of the die 402 to a corresponding contact on an opposite side of the bottom substrate 550, one or more conductors 460 configured to electrically connect a contact of the die 402 to a corresponding contact of a redistribution die (e.g., redistribution die(s) 406 shown at Stage 2), one or more conductors 466 configured to electrically connect a contact of a redistribution die to a corresponding contact of an interconnect conductor (e.g., interconnect conductors 520 shown at Stage 3), and one or more conductors 472 configured to electrically connect a contact of an interconnect conductor to a corresponding contact on an opposite side of the bottom substrate 550. In a particular example, the conductor(s) 460 correspond to or include the conductor(s) 114A of FIG. 1B or the conductor(s) 314 of FIG. 3B. In a particular example, the conductor(s) 466 correspond to or include the conductor(s) 114B of FIG. 1B.

Stage 2 of FIG. 5 illustrates a state after the redistribution die(s) 406 (e.g., redistribution dies 406A and 406B) have been placed on the bottom substrate 550. Solder bumps 504 of the redistribution die(s) 406 are reflowed to form electrical connections to corresponding contacts of the bottom substrate 550, such as contacts of the conductor(s) 460, 466, or both. The solder bumps 504 and the solder bumps 502 can be reflowed at the same time, or the solder bumps 502 can be reflowed prior to Stage 2.

In FIG. 5, the redistribution die(s) 406 are illustrated as including the redistribution traces 408 on a side adjacent to the bottom substrate 550, the redistribution traces 414 on a side opposite the bottom substrate 550, and the interconnect conductors 412 therebetween. As described with reference to FIG. 4A, the interconnect conductors 412 and the redistribution traces 414 are optional and are omitted in some cases. In implementations in which the interconnect conductors 412 and the redistribution traces 414 are omitted, contacts 438 on top of each redistribution die 406 can also be omitted.

Stage 3 illustrates a state after placement of interconnect conductors 520 (e.g., interconnect conductors 520A and interconnect conductors 520B) and a top substrate 530. In FIG. 5, the interconnect conductors 520 include or correspond to solder balls or solder-plated copper balls. The interconnect conductors 520, the top substrate 530, or both (e.g., the top substrate 530 with the interconnect conductors 520 attached) can be placed using automated placement techniques (e.g., a pick and place robot).

In FIG. 5, the top substrate 530 includes a preformed laminate substrate including metal layers separated from one another by dielectric layers. The metal layers are patterned and interconnected to define contacts 432, contacts 506, and a plurality of conductors 434 therebetween. The contacts 432 are configured to electrically connect to another die (e.g., second die 492 illustrated at Stage 5). The contacts 506 are configured to electrically connect to interconnect conductors, which may include the interconnect conductors 520, interconnect conductors 412 of the redistribution die(s) 406, or both. The conductors 434 of the top substrate 530 are configured to electrically connect respective one of the contacts 432 and the contacts 506. In a particular example, the conductor(s) 434 correspond to or include the conductor(s) 148 of FIG. 1B or the conductor(s) 348 of FIG. 3B. In some implementations, the interconnect conductors 520 are omitted. For example, if the redistribution die(s) 406 include the interconnect conductors 412 and the interconnect conductors 412 are sufficient to support all of the electrical connections needed between a top substrate (e.g., top substrate 530 illustrated at Stage 3) and bottom substrate 550, the interconnect conductors 520 are not needed and can be omitted.

If the interconnect conductors 520 are present, certain of the interconnect conductors 520 can be electrically connected, via conductors 466, to contacts of the redistribution die(s) 406. Additionally, or alternatively, certain of the interconnect conductors 520 can be electrically connected, via conductors 472, to contacts on an opposite side of the bottom substrate 550.

Stage 4 illustrates a state after a mold compound 422 is disposed in a region between the top substrate 530 and the bottom substrate 550. For example, the mold compound 422 can be disposed between the top substrate 530 and the bottom substrate 550 using over-molding operations, and can subsequently be cured or hardened by exposure to light, heat, and/or chemical hardening agents.

Stage 5 illustrates a state after the contacts 442 are formed on a bottom of the bottom substrate 550. If the operations described with reference to Stages 1-4 above are performed in a manner that forms two or more devices (e.g., device 590) concurrently, the state illustrated at Stage 5 is after singulation of the devices. For example, one or more cutting operations can be used to separate devices 590 from one another.

Formation of the device 590 is complete at Stage 5 of FIG. 5. However, in some implementations, the second die 492 can be coupled to the top substrate 530 and electrically connected to the interconnect conductors 520, to the redistribution die(s) 406, or both, to enable communication between the die 402 and the second die 492 and/or communication between the second die 492 and one or more off-package devices via the contacts 442.

Exemplary Flow Diagram of a Method for Fabricating a Device Including Redistribution Die(s)

Figure 6:
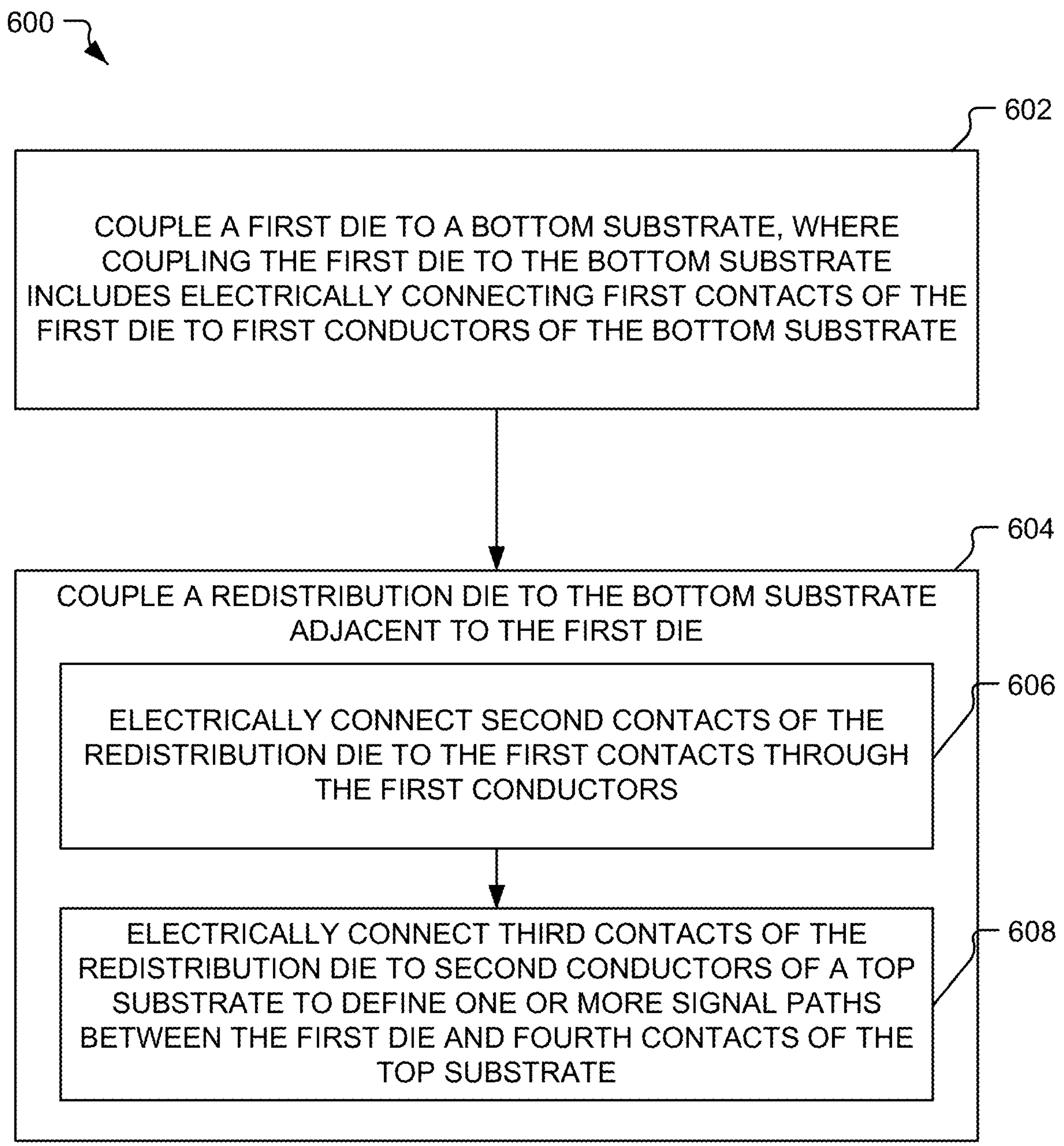
FIG. 6 illustrates an exemplary flow diagram of a method for fabricating a device including one or more redistribution dies.

In some implementations, fabricating a device that includes one or more redistribution dies includes several processes. FIG. 6 illustrates an exemplary flow diagram of a method 600 for providing or fabricating a device that includes one or more redistribution dies. In some implementations, the method 600 of FIG. 6 may be used to provide or fabricate any of the devices 100, 200, 300, 490, or 590, of FIGS. 1A-5.

It should be noted that the method 600 of FIG. 6 may combine one or more processes in order to simplify and/or clarify the method for providing or fabricating a device that includes one or more redistribution dies. In some implementations, the order of the processes may be changed or modified.

The method 600 includes, at block 602, coupling a first die to a bottom substrate, where coupling the first die to the bottom substrate includes electrically connecting first contacts of the first die to first conductors of the bottom substrate. For example, the first die can correspond to the die 104 of any of FIGS. 1A-3B and the bottom substrate can correspond to the bottom substrate 102 of any of FIGS. 1A-3B. As another example, the first die can correspond to the die 402 of FIGS. 4A and 4B, and the bottom substrate can correspond to the bottom substrate 450 of FIG. 4B. As yet another example, the first die can correspond to the die 402 of FIG. 5, and the bottom substrate can correspond to the bottom substrate 550 of FIG. 5. The first contacts (e.g., the contacts 110 of the die 104) can be electrically connected to conductors of the bottom substrate via solder arranged in an array of microbumps (e.g., the solder bumps 502 of FIG. 5). Operations to electrically connect conductors of a bottom substrate and contacts of a die are described with reference to Stage 7 of FIG. 4B and Stage 1 of FIG. 5.

The method 600 also includes, at block 604, coupling a redistribution die to the bottom substrate adjacent to the first die. For example, the redistribution die can correspond to one of the redistribution die(s) 108 of FIGS. 1A and 1B, one of the redistribution die(s) 208 of FIGS. 2A and 2B, one of the redistribution die(s) 308 of FIGS. 3A and 3B, or one of the redistribution die(s) 406 of FIGS. 4A-5. Operations to couple a bottom substrate and contacts of a redistribution die are described with reference to Stage 7 of FIG. 4B and Stage 2 of FIG. 5. In a particular aspect, the redistribution die includes a semiconductor die, and the second contacts (e.g., the contacts 116 of FIG. 1A), the third contacts (e.g., the contacts 122 of FIG. 1A), and redistribution traces (e.g., the redistribution traces 120 of FIG. 1A) therebetween are integrated within the semiconductor die.

In FIG. 6, coupling the redistribution die to the bottom substrate includes, at block 606, electrically connecting second contacts of the redistribution die to the first contacts through the first conductors and, at block 608, electrically connecting third contacts of the redistribution die to second conductors of a top substrate to define one or more signal paths between the first die and a first subset of fourth contacts of the top substrate. For example, as illustrated at Stage 7 of FIG. 4B, the first contacts of the first die can correspond to the contacts 458, which are coupled to the contacts 462 (e.g., the second contacts of the redistribution die) through the conductors 460 of the bottom substrate 450. Further, in this example, third contacts of the redistribution (e.g., the contacts 464 or the contacts 438) are coupled to conductors 434 of the top substrate 430 to define one or more signal paths between the first die (e.g., the die 402) and at least a subset of the contacts 432 of the top substrate 430.

In some implementations, the method 600 also includes coupling a second die to the fourth contacts of the top substrate. For example, the second die can include or correspond to the die 144 of FIG. 1B or 3B, or the die 492 of FIG. 4B or 5. The first and second dies are configured to operate cooperatively. For example, in some implementations, the first die includes first circuitry defining one or more processor cores, and the second die includes second circuitry defining one or more memory cells.

In some implementations, at least some of the interconnect conductors are integrated within the redistribution die. For example, the interconnect conductors integrated within the redistribution die can include or correspond to the interconnect conductors 306 of FIG. 3B or the interconnect conductors 412 of FIG. 4A, 4B, or 5.

In the same or different implementations, at least some of the interconnect conductors are external to the redistribution die and electrically connected, through the first conductors, to the third contacts of the redistribution die. When at least some of the interconnect conductors are external to the redistribution die, the method 600 also includes electrically connecting the interconnect conductors that are external to the redistribution die to the second conductors of the top substrate, where the interconnect conductors are electrically connected to the third contacts of the redistribution die. For example, the interconnect conductors that are external to the redistribution die can include or correspond to the interconnect conductors 106 of FIGS. 1A-2B, the interconnect conductors 420 of FIGS. 4A and 4B, or interconnect conductors 520 of FIG. 5.

In some implementations, the method 600 also includes disposing one or more additional redistribution dies on the bottom substrate adjacent to the first die and electrically connecting the one or more additional redistribution dies between the first die and a second subset of the fourth contacts to define one or more additional signal paths between the first die and the second subset of the fourth contacts of the top substrate. For example, the redistribution die can include the redistribution die 108A of FIGS. 1A and 1B, and the one or more additional redistribution dies can include the redistribution die 108B. As another example, the redistribution die can include the redistribution die 208A of FIGS. 2A and 2B, and the one or more additional redistribution dies can include any of the redistribution dies 208B, 208C, or 208D. As another example, the redistribution die can include the redistribution die 308A of FIGS. 3A and 3B, and the one or more additional redistribution dies can include the redistribution die 308B. As still another example, the redistribution die can include the redistribution die 406A of FIG. 4A, 4B, or 5, and the one or more additional redistribution dies can include the redistribution die 406B.

Exemplary Electronic Devices

Figure 7:
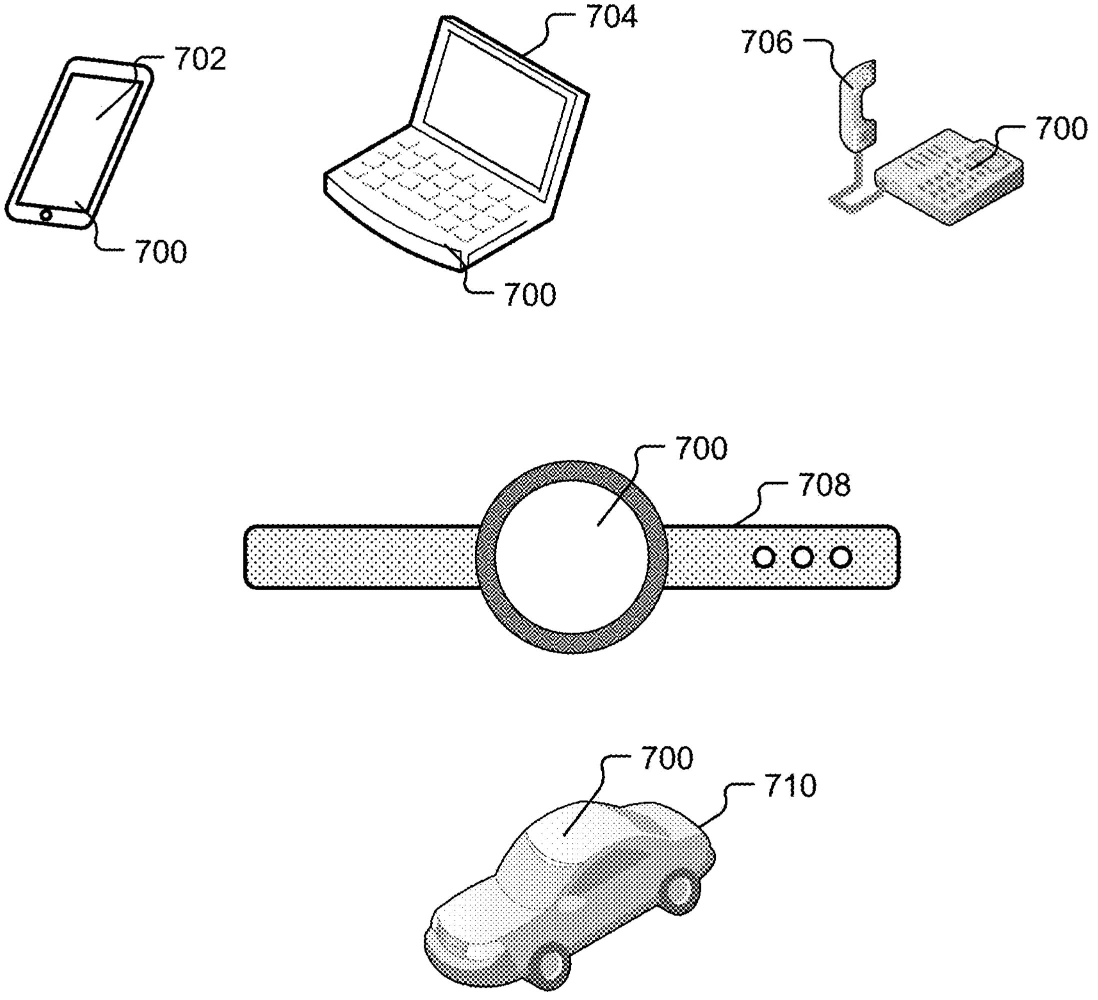
FIG. 7 illustrates various electronic devices that may integrate a device including one or more redistribution dies as described herein.

FIG. 7 illustrates various electronic devices that may include or be integrated with any of the devices 100, 200, 300, 490, or 590 of FIGS. 1A-5. For example, a mobile phone device 702, a laptop computer device 704, a fixed location terminal device 706, a wearable device 708, or a vehicle 710 (e.g., an automobile or an aerial device) may include a device 700. The device 700 can include, for example, any of the devices 100, 200, 300, 490, or 590 of FIGS. 1A-5 described herein. The devices 702, 704, 706 and 708 and the vehicle 710 illustrated in FIG. 7 are merely exemplary. Other electronic devices may also feature the device 700 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in vehicles (e.g., autonomous vehicles), or any other device that stores or retrieves data or computer instructions, or any combination thereof.

One or more of the components, processes, features, and/or functions illustrated in FIGS. 1A-7 may be rearranged and/or combined into a single component, process, feature or function or embodied in several components, processes, or functions. Additional elements, components, processes, and/or functions may also be added without departing from the disclosure. It should also be noted FIGS. 1A-7 and its corresponding description in the present disclosure is not limited to dies and/or ICs. In some implementations, FIGS. 1A-7 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. An object A, that is coupled to an object B, may be coupled to at least part of object B. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to as a second component, may be the first component, the second component, the third component or the fourth component. The terms "encapsulate", "encapsulating" and/or any derivation means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1. A "plurality" of components may include all the possible components or only some of the components from all of the possible components. For example, if a device includes ten components, the use of the term "the plurality of components" may refer to all ten components or only some of the components from the ten components.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

According to Example 1, an integrated device includes a bottom substrate comprising first conductors; a top substrate comprising second conductors; a first die disposed between the bottom substrate and the top substrate, the first die including circuitry and first contacts electrically connected to the circuitry and to the first conductors; and a redistribution die disposed between the bottom substrate and the top substrate adjacent to the first die. The redistribution die includes: second contacts electrically connected to the first contacts through the first conductors; third contacts electrically connected to the second conductors; and redistribution traces electrically connected to the second contacts and to the third contacts. The top substrate includes fourth contacts electrically connected through the second conductors to the third contacts to define one or more signal paths between the fourth contacts and the first die.

Example 2 includes the integrated device of Example 1, wherein the redistribution die comprises a semiconductor die, and wherein the redistribution traces are integrated within the semiconductor die.

Example 3 includes the integrated device of Example 1 or Example 2 and further includes interconnect conductors disposed between the bottom substrate and the top substrate and defining a portion of the one or more signal paths between the fourth contacts and the first die.

Example 4 includes the integrated device of Example 3, wherein at least one of the interconnect conductors is integrated within the redistribution die.

Example 5 includes the integrated device of Example 3 or Example 4, wherein at least one of the interconnect conductors is external to the redistribution die and electrically connected, through the first conductors, to the third contacts of the redistribution die.

Example 6 includes the integrated device of any of Examples 1 to 5, wherein the fourth contacts are configured to be coupled to a second die comprising second circuitry.

Example 7 includes the integrated device of Example 6, wherein the circuitry of the first die defines one or more processor cores and the second circuitry of the second die defines one or more memory cells.

Example 8 includes the integrated device of any of Examples 1 to 7 and further includes one or more additional redistribution dies disposed between the bottom substrate and the top substrate adjacent to the first die and configured to define one or more additional signal paths between the first die and the fourth contacts.

Example 9 includes the integrated device of any of Examples 1 to 8 and further includes a second redistribution die disposed between the bottom substrate and the top substrate on an opposite side of the first die from the redistribution die, the second redistribution die configured to define portions of second signal paths between the first die and the fourth contacts.

Example 10 includes the integrated device of Example 9 and further includes a third redistribution die disposed between the bottom substrate and the top substrate and configured to define portions of third signal paths between the first die and the fourth contacts.

Example 11 includes the integrated device of Example 10 and further includes a fourth redistribution die disposed between the bottom substrate and the top substrate and configured to define portions of fourth signal paths between the first die and the fourth contacts.

Example 12 includes the integrated device of any of Examples 1 to 11, wherein the first die and a second die coupled to the fourth contacts are integrated in a package-on-package configuration.

According to Example 13, a method of fabricating an integrated device includes coupling a first die to a bottom substrate, where coupling the first die to the bottom substrate includes electrically connecting first contacts of the first die to first conductors of the bottom substrate; and coupling a redistribution die to the bottom substrate adjacent to the first die. Coupling the redistribution die to the bottom substrate includes: electrically connecting second contacts of the redistribution die to the first contacts through the first conductors; and electrically connecting third contacts of the redistribution die to second conductors of a top substrate to define one or more signal paths between the first die and a first subset of fourth contacts of the top substrate.

Example 14 includes the method of Example 13, wherein the redistribution die comprises a semiconductor die, and wherein the second contacts, the third contacts, and redistribution traces therebetween are integrated within the semiconductor die.

Example 15 includes the method of Example 13 or Example 14, further comprising coupling a second die to the fourth contacts of the top substrate.

Example 16 includes the method of Example 15, wherein the first die includes first circuitry defining one or more processor cores and the second die includes second circuitry defining one or more memory cells.

Example 17 includes the method of any of Examples 13 to 16 and further includes electrically connecting interconnect conductors to the second conductors of the top substrate, wherein the interconnect conductors are electrically connected to the third contacts of the redistribution die.

Example 18 includes the method of Example 17, wherein at least one of the interconnect conductors is integrated within the redistribution die.

Example 19 includes the method of Examples 17 or Example 18, wherein at least one of the interconnect conductors is external to the redistribution die and electrically connected, through the first conductors, to the third contacts of the redistribution die.

Example 20 includes the method of any of Examples 13 to 19 and further includes disposing one or more additional redistribution dies on the bottom substrate adjacent to the first die; and electrically connecting the one or more additional redistribution dies between the first die and the fourth contacts to define one or more additional signal paths between the first die and a second subset of the fourth contacts of the top substrate.

According to Example 21, a device includes a bottom substrate comprising first conductors; a top substrate comprising second conductors; and a first die disposed between the bottom substrate and the top substrate. The first die includes circuitry and first contacts electrically connected to the circuitry and to the first conductors. The device includes a redistribution die disposed between the bottom substrate and the top substrate. The redistribution die includes: second contacts electrically connected to the first contacts through the first conductors; third contacts electrically connected to the second conductors; and redistribution traces electrically connected to the second contacts and to the third contacts. The device includes a second die electrically connected to fourth contacts of the top substrate, where the fourth contacts are electrically connected through the second conductors to the third contacts to define one or more signal paths between the first die and the second die.

Example 22 includes the device of Example 21, wherein the redistribution die comprises a semiconductor die, and wherein the redistribution traces are integrated within the semiconductor die.

Example 23 includes the device of Example 21 or Example 22, further comprising interconnect conductors disposed between the bottom substrate and the top substrate and defining a portion of the one or more signal paths between the fourth contacts and the first die.

Example 24 includes the device of Example 23, wherein at least one of the interconnect conductors is integrated within the redistribution die.

Example 25 includes the device of Example 23 or Example 24, wherein at least one of the interconnect conductors is external to the redistribution die and electrically connected, through the first conductors, to the third contacts of the redistribution die.

Example 26 includes the device of any of Examples 21 to 25, wherein the circuitry of the first die defines one or more processor cores, and wherein the second die includes second circuitry defining one or more memory cells.

Example 27 includes the device of any of Examples 21 to 26 and further includes one or more additional redistribution dies disposed between the bottom substrate and the top substrate adjacent to the first die and configured to define one or more additional signal paths between the first die and the second die.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. An integrated device comprising:
- a bottom substrate comprising first conductors;
- a top substrate comprising second conductors;
- a first die disposed between the bottom substrate and the top substrate, the first die including circuitry and first contacts electrically coupled to the circuitry and to the first conductors; and
- a redistribution die disposed between the bottom substrate and the top substrate adjacent to the first die, the redistribution die including:
  - second contacts electrically coupled to the first contacts through first particular conductors of the first conductors;
  - third contacts electrically coupled to the second conductors through second particular conductors of the first conductors distinct from the first particular conductors; and
  - redistribution traces electrically coupled to the second contacts and to the third contacts; and
- wherein the top substrate includes fourth contacts electrically coupled through the second conductors to the third contacts to define one or more signal paths between the fourth contacts and the first die.

2. The integrated device of claim 1, wherein the redistribution die comprises a semiconductor die, and wherein the redistribution traces are integrated within the semiconductor die.

3. The integrated device of claim 1, further comprising:
- interconnect conductors disposed between the bottom substrate and the top substrate and defining a portion of the one or more signal paths between the fourth contacts and the first die.

4. The integrated device of claim 3, wherein at least one of the interconnect conductors is integrated within the redistribution die.

5. The integrated device of claim 3, wherein at least one of the interconnect conductors is external to the redistribution die and electrically coupled, through the first conductors, to the third contacts of the redistribution die.

6. The integrated device of claim 1, wherein the fourth contacts are configured to be coupled to a second die comprising second circuitry.

7. The integrated device of claim 6, wherein the circuitry of the first die defines one or more processor cores and the second circuitry of the second die defines one or more memory cells.

8. The integrated device of claim 1, further comprising one or more additional redistribution dies disposed between the bottom substrate and the top substrate adjacent to the first die and configured to define one or more additional signal paths between the first die and the fourth contacts.

9. The integrated device of claim 1, further comprising a second redistribution die disposed between the bottom substrate and the top substrate on an opposite side of the first die from the redistribution die, the second redistribution die configured to define portions of second signal paths between the first die and the fourth contacts.

10. The integrated device of claim 9, further comprising a third redistribution die disposed between the bottom substrate and the top substrate and configured to define portions of third signal paths between the first die and the fourth contacts.

11. The integrated device of claim 10, further comprising a fourth redistribution die disposed between the bottom substrate and the top substrate and configured to define portions of fourth signal paths between the first die and the fourth contacts.

12. The integrated device of claim 1, wherein the first die and a second die coupled to the fourth contacts are integrated in a package-on-package configuration.

13. A method of fabricating an integrated device, the method comprising:

coupling a first die to a bottom substrate, wherein coupling the first die to the bottom substrate includes electrically coupling first contacts of the first die to first conductors of the bottom substrate; and coupling a redistribution die to the bottom substrate adjacent to the first die, wherein coupling the redistribution die to the bottom substrate includes:

electrically coupling second contacts of the redistribution die to the first contacts through the first conductors; and electrically coupling third contacts of the redistribution die to second conductors of a top substrate to define one or more signal paths between the first die and a first subset of fourth contacts of the top substrate.

14. The method of claim 13, wherein the redistribution die comprises a semiconductor die, and wherein the second contacts, the third contacts, and redistribution traces therebetween are integrated within the semiconductor die.

15. The method of claim 13, further comprising coupling a second die to the fourth contacts of the top substrate.

16. The method of claim 15, wherein the first die includes first circuitry defining one or more processor cores and the second die includes second circuitry defining one or more memory cells.

17. The method of claim 13, further comprising electrically coupling interconnect conductors to the second conductors of the top substrate, wherein the interconnect conductors are electrically coupled to the third contacts of the redistribution die.

18. The method of claim 17, wherein at least one of the interconnect conductors is integrated within the redistribution die.

19. The method of claim 17, wherein at least one of the interconnect conductors is external to the redistribution die and electrically coupled, through the first conductors, to the third contacts of the redistribution die.

20. The method of claim 13, further comprising:

disposing one or more additional redistribution dies on the bottom substrate adjacent to the first die; and electrically coupling the one or more additional redistribution dies between the first die and the fourth contacts to define one or more additional signal paths between the first die and a second subset of the fourth contacts of the top substrate.

21. A device comprising:

a bottom substrate comprising first conductors;

a top substrate comprising second conductors;

a first die disposed between the bottom substrate and the top substrate, the first die including circuitry and first contacts electrically coupled to the circuitry and to the first conductors;

a redistribution die disposed between the bottom substrate and the top substrate, the redistribution die including:

second contacts electrically coupled to the first contacts through the first conductors;

third contacts electrically coupled to the second conductors; and redistribution traces electrically coupled to the second contacts and to the third contacts; and a second die electrically coupled to fourth contacts of the top substrate, wherein the fourth contacts are electrically coupled connected through the second conductors to the third contacts to define one or more signal paths between the first die and the second die.

22. The device of claim 21, wherein the redistribution die comprises a semiconductor die, and wherein the redistribution traces are integrated within the semiconductor die.

23. The device of claim 21, further comprising interconnect conductors disposed between the bottom substrate and the top substrate and defining a portion of the one or more signal paths between the fourth contacts and the first die.

24. The device of claim 23, wherein at least one of the interconnect conductors is integrated within the redistribution die.

25. The device of claim 23, wherein at least one of the interconnect conductors is external to the redistribution die and electrically coupled, through the first conductors, to the third contacts of the redistribution die.

26. The device of claim 21, wherein the circuitry of the first die defines one or more processor cores, and wherein the second die includes second circuitry defining one or more memory cells.

27. The device of claim 21, further comprising one or more additional redistribution dies disposed between the bottom substrate and the top substrate adjacent to the first die and configured to define one or more additional signal paths between the first die and the second die.

* * * * *